United States Patent
Rumsby

(10) Patent No.: US 8,779,326 B2
(45) Date of Patent: Jul. 15, 2014

(54) METHOD AND APPARATUS FOR LASER BEAM ALIGNMENT FOR SOLAR PANEL SCRIBING

(75) Inventor: Philip Rumsby, Witney (GB)

(73) Assignee: Tel Solar AG, Trubbach (CH)

( * ) Notice: Subject to any disclaimer, the term of this patent is extended or adjusted under 35 U.S.C. 154(b) by 1014 days.

(21) Appl. No.: 12/513,770

(22) PCT Filed: Nov. 5, 2007

(86) PCT No.: PCT/GB2007/004210
§ 371 (c)(1),
(2), (4) Date: Jul. 31, 2009

(87) PCT Pub. No.: WO2008/056116
PCT Pub. Date: May 15, 2008

(65) Prior Publication Data
US 2009/0324903 A1    Dec. 31, 2009

(30) Foreign Application Priority Data
Nov. 8, 2006 (GB) .................................. 0622232.7

(51) Int. Cl.
*B23K 26/38* (2006.01)
*B23K 26/03* (2006.01)
*B23K 26/04* (2006.01)
(52) U.S. Cl.
USPC ............. 219/121.69; 219/121.76; 219/121.83
(58) Field of Classification Search
USPC ............. 219/121.68, 121.69, 121.62, 121.81, 219/121.83
See application file for complete search history.

(56) References Cited

U.S. PATENT DOCUMENTS

| | | | |
|---|---|---|---|
| 3,549,733 A * | 12/1970 | Caddell | 219/121.69 |
| 4,877,939 A | 10/1989 | Duley et al. | |
| 4,940,879 A * | 7/1990 | De-Swaan | 219/121.67 |
| 5,109,148 A * | 4/1992 | Fujita et al. | 219/121.83 |
| 5,801,356 A | 9/1998 | Richman | |
| 6,300,593 B1 * | 10/2001 | Powell | 219/121.68 |

(Continued)

FOREIGN PATENT DOCUMENTS

| | | | |
|---|---|---|---|
| DE | 10 2006 051 556 A1 | 5/2008 | |
| EP | 1061589 A3 | 12/2000 | |

(Continued)

OTHER PUBLICATIONS

Machine translation of Japan Patent document No. 10-113,785, Sep. 2012.*

(Continued)

*Primary Examiner* — Geoffrey S Evans
(74) *Attorney, Agent, or Firm* — Pearne & Gordon LLP

(57) ABSTRACT

A device for accurately positioning laser scribed lines in a thin top layer of material with respect to lines already scribed in lower layers for the purpose of making solar panels. An alignment detector system is attached to and displaced from an optics unit that generates laser beams by a distance such that the detector measures the position of scribed lines in the lower layers in the area of the panel that will be scribed at a subsequent time. A motion and control system moves the panel such that the detector follows the path of one or more of the lines scribed in one of the lower layers and measures the position of the lines. The system accepts data from the alignment detector and uses the data to correct the relative position of the optics unit.

12 Claims, 4 Drawing Sheets

(56) References Cited

U.S. PATENT DOCUMENTS

| | | | |
|---|---|---|---|
| 6,562,698 B2 * | 5/2003 | Manor | 438/460 |
| 6,815,636 B2 * | 11/2004 | Chung et al. | 219/121.83 |
| 2002/0148721 A1 * | 10/2002 | Lindquist et al. | 204/242 |
| 2003/0029848 A1 | 2/2003 | Borgeson et al. | |
| 2003/0180983 A1 | 9/2003 | Oswald | |
| 2003/0209527 A1 * | 11/2003 | Borgeson et al. | 219/121.69 |
| 2006/0012331 A1 * | 1/2006 | Gillette | 320/107 |
| 2009/0000108 A1 | 1/2009 | Manz | |

FOREIGN PATENT DOCUMENTS

| | | | |
|---|---|---|---|
| GB | 611738 A | | 11/1948 |
| GB | 2439962 A | | 1/2008 |
| JP | 10-113785 A | * | 5/1998 |
| JP | 10209475 A | | 8/1998 |
| JP | 10-303444 A | * | 11/1998 |
| JP | 11-298017 A | | 10/1999 |
| JP | 2002-009315 A | * | 1/2002 |
| JP | 2002-076402 A | | 3/2002 |
| JP | 2005-081715 A | | 3/2005 |
| JP | 2006-041322 A | | 2/2006 |
| KR | 10-2004-0099323 A | | 11/2004 |
| WO | 0141967 A1 | | 6/2001 |
| WO | 2007144565 A3 | | 12/2007 |
| WO | WO-2007/144565 A2 | * | 12/2007 |

OTHER PUBLICATIONS

Machine translation of Japan Patent document No. 2002-9,315, Sep. 2012.*
International Search Report for PCT/GB2007/004210 dated Apr. 17, 2008.
Taiwanese Office action for 096142002 dated Apr. 10, 2012.
European Search Report for 10015225.5 dated Oct. 6, 2011.

* cited by examiner

METHOD AND APPARATUS FOR LASER BEAM ALIGNMENT FOR SOLAR PANEL SCRIBING

TECHNICAL FIELD

This invention relates to a new method for accurately aligning the parallel laser scribes that are used to divide up large thin film solar panels with respect to existing scribed lines on the panel and is based on a detection system that records the position of existing lines at a location adjacent to that being scribed while scribing of other lines is proceeding. Such a method allows the position of secondary scribed lines to be placed very accurately with respect to previously scribed lines and permits compensation for irregularities in position caused by distortion of the panel.

BACKGROUND ART

The use of lasers for scribing the thin layers found in solar panels to create and interconnect sub cells been well known for many years. The technology consists of laying down a thin layer of the lower electrode material, often a transparent conducting oxide such as tin oxide, zinc oxide or indium tin oxide, on a glass plate and laser scribing lines at typically 5-10 rnrn intervals to separate the layer into electrically isolated regions. The electricity generating layer, such as amorphous silicon, is then applied over the whole area and a laser is used again to scribe lines in this layer parallel to and as close as possible to the initial scribes in the first layer. A third, top layer, often a metal such as aluminium, is then applied and a laser beam is used for the third time to scribe lines in this layer as close to and parallel to the other lines to break the electrical continuity.

By this method an electrical series connection is made between all the cells in the panel so that the voltage generated by the whole panel is given by the product of the potential formed within each cell and the number of cells. Typically panels are divided up into 50-100 cells so that overall panel output voltages are in the 50 volt range. JP10209475 gives a thorough description of the standard laser processes used.

As well as ITO/Silicon/Aluminium structures many other materials can be used to make solar panels. Other equally effective devices are made based on Cadmium Telluride (CdTe), Copper-Indium-diselenide (CIS) and crystalline silicon on glass (CSG). In all cases lasers are used to scribe some or all of the layers involved.

The laser beams that are used to scribe individual layers are sometimes applied from the coated side of the glass sheet but can also be applied from the opposite side in which case the beams pass through the glass before interacting with the film. The 10 lasers used generally operate in the infra-red (1064 nm wavelength) region of the spectrum but lasers operating at the 2nd harmonic wavelength (532 mm) are also widely used. Even UV lasers are sometimes used. The lasers are generally pulsed with pulse lengths in the range of a few to several 100 nanoseconds and operate at pulse repetition rates in the range of a few kHz to few 100 kHz In some cases solar panels are made on non-transparent substrates such as metal sheets. In this case irradiation through the substrate is not possible so all scribing processes require beams incident from the coated side. In some other cases solar panels are fabricated on flexible substrates such as thin metal or polymer sheets. In the former case irradiation from only the coated side is possible. In the latter case irradiation from the coated side or through the substrate are both possible.

The common characteristics of all these devices is that multiple scribes each up to one or more meters in length have to be created in order to divide up each layer on a panel. Hence total scribe lengths per layer up to well over 100 m often need to be made by solar panel process tools in acceptable panel process times. Depending on the panel size, the production line output requirements and the number of tools, for these process times are generally required to be in the range 1 to 3 minutes. This means that laser scribing rates up to many meters per second are required.

Laser tools have already been built to achieve this. In some cases the tools have stationary optics which means the panel has to be moved very rapidly in one direction and then stepped in the other. To avoid excessive panel speed optics units having multiple parallel beams are often used. As an example of this a panel with dimension of about 1.1 m×1.1 m requiring 160 separate scribes can be processed with 8 parallel beams in under 100 second with the panel moving at a maximum speed of less than 300 mm/sec.

In the case discussed above the beam unit with multiple beams are stationary and the panel is moved in two dimensions. Other arrangements are also possible. In another case the panel is held stationary and the beam or optics unit is moved in two dimensions by means of a moving gantry over the panel. An intermediate approach is also possible where the panel moves in one axis and the optics unit moves in the other on a gantry over the panel.

Another solar panel scribing approach uses a single beam to scribe all the lines but causes the beam to move at high speed using a galvanometer driven mirror scanner system. US Patent Application Publication No. US2003/0209527A1 describes such a case. A scanner system is used to move the laser beam across the full width of a 600 mm wide panel at speeds up to 4 meters/sec while the panel is moved in the orthogonal direction past the scanner unit.

Application GB0611738.6 describes an extension of this invention where a scanner unit is used to move the beam at high speed as discussed in US2003/0209527A1 but the length of the beam scan region generated by the scanner unit is limited to a fraction of the total line length required rather than the full line length. The consequence of this is that multiple bands are needed to scribe the full lengths of the lines. This means that as well as the beam motion by the scanner unit motion of the substrate in two axes with respect of the scanner unit is required in order to cover the full area.

Whatever method of beam motion with respect to the panel is used the laser scribes in the electricity generating layer and top electrode layer need to be placed reliably very close to existing scribes in lower layers to minimize the inactive area between the scribes. Because of panel distortions and size changes during manufacture it is necessary to measure the position of previous scribes and compensate by adjusting the panel or beam motion to maintain accurate relative positioning. A global measurement of overall panel expansion or shrinkage is readily made by measuring the position and angle of the first and last scribes on a panel after loading. This data can be used to correct for these global changes by adjusting the parameters that control the beam motion with respect to the panel. However, simple global distortion correction is not sufficient to allow close and accurate placement of scribes since scribe pitch can become irregular due to errors on the tool that make the first scribe or errors introduced ring subsequent panel processing an 'on-line' system that ensures that all scribes are accurately placed with respect to previous scribes. We call our alignment system "dynamic scribe alignment" (DSA). Application GB611718.6 describes the use of such an alignment system for the case where a scanner is used to move the beam and the panel is scribed in a series of parallel bands perpendicular to the scribe line direction. In this application we describe the use of a dynamic scribe alignment system where scanners are not used and instead one or more beams are used to scribe the panel in a series of lines or bands parallel to the scribe direction.

DISCLOSURE OF INVENTION

According to a first aspect of the present invention there is provided a method for accurately positioning laser scribed lines characterised by processing a thin top layer of material which overcoats one or more other lower layers in which lines have already been scribed for the purpose of making solar panels by means of:
- an optics unit that generates one or more laser beams in order to scribe one or more lines in the top layer on the panel;
- an alignment detector system that is attached to the optics unit, the detector being displaced from the optics unit by a distance such that the detector measures the position of one of the scribes in the lower layers in the area of the panel that will be scribed at a subsequent time;
- a control and motion system where data from the alignment detector attached to the optics unit is used to correct the relative position of the optics unit with respect to the panel in the direction perpendicular to the scribe direction in order to allow the laser scribed lines to be accurately placed with respect to lines already scribed in a lower layer; and
- a motion system where the panel is moving with respect to the optics unit and the alignment detector follows the path of one or more of the lines scribed in one of the lower layers and measures the position of the line or lines over the full length while laser scribing of the top layer by the optics unit proceeds in a different area of the panel.

According to a first preferred version of the first aspect of the present invention the method is characterised in that the optics unit with associated alignment detector delivers a single beam to the panel.

According to a second preferred version of the first aspect of the present invention the method is characterised in that the optics unit with associated alignment detector delivers a plurality of beams to the panel.

According to a third preferred version of the first aspect of the present invention or of the first preferred version thereof the method is characterised in that a single optics unit with associated alignment detector is used to scribe the panel in a series of single lines.

According to a fourth preferred version of the first aspect of the present invention or of the first or second preferred versions thereof the method is characterised in that multiple optics units, each with its own alignment detector and each able to move independently in the direction perpendicular to the scribe line direction, are used in parallel to scribe the panel in a series of bands of scribes.

According to a fifth preferred version of the first aspect of the present invention or of any preceding preferred version thereof the method is characterised in that the optics unit and associated alignment detector is situated on the coated side of the panel.

According to a sixth preferred version of the first aspect of the present invention or of any preceding preferred version thereof the method is characterised in that the substrate material of the solar panel is optically opaque.

According to a seventh preferred version of the present invention or of any of the preceding first to fourth preferred version thereof the method is characterised in that the optics unit and associated alignment detector is situated on the opposite side of the panel to the coated side.

According to an eighth preferred version of the first aspect of the present invention or any of the preceding first to sixth preferred versions thereof the method is characterised in that the substrate material of the solar panel is optically transparent.

According to a ninth preferred version of the first aspect of the present invention or any preceding preferred version thereof the method is characterised in that the substrate material of the solar panel is rigid.

According to a tenth preferred version of the first aspect of the present invention or of any of the first to eighth preferred versions thereof the method is characterised in that the substrate material of the solar panel is flexible.

According to an eleventh preferred version of the first aspect of the present invention the method is characterised in that the alignment detector unit consists of an optical system that creates an image of the pre-scribed line in the lower layer on a one or two dimensional array detector such as a CCD camera.

According to a twelfth preferred version of the first aspect of the present invention the method is characterised in that the DSA detector unit consists of some other optical method for detecting and measuring the position of the pre-scribed line in the lower layer.

According to a thirteenth preferred version of the first aspect of the present invention or of any preceding preferred version thereof the method is characterised in that the panel moves in one axis on a linear stage and the optics units and associated alignment detectors move independently on an orthogonal stage mounted over or under the panel.

According to a fourteenth preferred version of the first aspect of the present invention or of any of the preceding first to ninth preferred versions thereof the method is characterised in that the panel is held stationary during scribing and the optics units and associated alignment detectors move independently on an orthogonal stage mounted over or under the panel this stage being mounted on a another stage that moves the first stage along the full length of the panel.

According to a fifteenth preferred version of the first aspect of the present invention or of any of the preceding first to ninth preferred versions thereof the method is characterised in that a single optics unit and associated alignment detector is held stationary during scribing and the panel is moved in two axes to cover the full panel area.

According to a sixteenth preferred version of the first aspect of the present invention or of any of the preceding first to ninth preferred versions thereof the method is characterised in that the panel is moved in two axes to cover the full panel area and more than one optics unit each with its associated alignment detector are used to scribe the panel, one optics unit being fixed and all others being able to move independently on a stage in the direction perpendicular to the scribe line direction.

According to a second aspect of the present invention there is provided a laser ablation tool characterised by being adapted to carrying out the method of the first aspect or of any preferred version thereof.

According to a third aspect of the present invention there is provided a product characterised by being formed by means of a method according to the first aspect or of any preceding preferred versions thereof.

One of the major problems that arises during the scribing of solar panels is the accurate control of scribe position on the surface of the panel. Most solar panel manufacturing arrangements require three separate sequential laser scribing operations. The first series of scribed lines are made in the lower electrode layer. The positioning accuracy requirements for the scribes in this first layer are much less critical compared to the subsequent scribes in the 2nd and 31d layers since these later scribes have to be placed very accurately with respect to the previous scribes in order to minimise the inactive area of the panel between the 3 parallel scribes. This means that the scribes have to be placed as close together as possible but must not touch. The accuracy of beam placement required with respect to the existing scribes is at the micrometer level or better. If the panel is scribed with a single beam in a series of separate lines or by an optics unit having multiple beams in a series of bands of lines, a suitable detector system is used to measure the position on the panel of the existing scribes in a lower layer that are adjacent to the line or band being scribed while the scribing is taking place. The data gathered is stored and used to correct the panel or optics unit motion when the measured band is subsequently scribed. In this way the system is continuously measuring the exact position of the previously scribed lines in the next band to be scribed while accurate placement of secondary scribes with respect to primary scribes in each band is being performed. We call this alignment technique "dynamic scribe alignment" (DSA).

Dynamic scribe alignment (DSA) is implemented in its simplest form by attaching a suitable detector to each optics unit. The detector is offset from the beam centre in the direction perpendicular to the scribe lines by a distance that places it within the width of the adjacent scribe line band. In this position, as the optics unit is moved over the surface of the panel or the panel is moved below the optics unit, the detector records the position of one or more of the scribed lines in the band of lines that will next be scribed.

Since the motion of the optics unit is along the scribe lines A the detector is following one or more of the adjacent existing scribe lines. A detector for this application is some form of optical imaging system where an image of the existing scribe line is projected onto a suitable 1 or 2D array camera such as a CCD camera. Periodic logging of the output data from the camera gives information on the distance from the optics head to the scribe line or lines being followed and allows deviation of the scribes from the expected path to be recorded. This data is linked to data generated by the position encoders on the gantry or panel stage to give a complete record of the scribe line position over its full length. After a complete band has been scribed so that the complete set of data about the position of one or more scribe lines in the As well as ITO/Silicon/Aluminium structures many other materials can be used to make solar panels. Other equally effective devices are made based on Cadmium Telluride (CdTe), Copper-Indium-diselenide (CIS) and crystalline silicon on glass (CSG). In all cases lasers are used to scribe some or all of the layers involved.

The laser beams that are used to scribe individual layers are sometimes applied from the coated side of the glass sheet but can also be applied from the opposite side in which case the beams pass through the glass before interacting with the film. The lasers used generally operate in the infra-red (1064 nm wavelength) region of the spectrum but lasers operating at the 2nd harmonic wavelength (532 mm) are also widely used. Even UV lasers are sometimes used. The lasers are generally pulsed with pulse lengths in the range of a few to several 100 nanoseconds and operate at pulse repetition rates in the range of a few kHz to few 100 kHz In some cases solar panels are made on non-transparent substrates such as metal sheets. In this case irradiation through the substrate is not possible so all scribing processes require beams incident from the coated side. In some other cases solar panels are fabricated on flexible substrates such as thin metal or polymer sheets. In the former case irradiation from only the coated side is possible. In the latter case irradiation from the coated side or through the substrate are both possible.

The common characteristics of all these devices is that multiple scribes each up to one or more meters in length have to be created in order to divide up each layer on a panel. Hence total scribe lengths per layer up to well over 100 m often need to be made by solar panel process tools in acceptable panel process times. Depending on the panel size, the production line output requirements and the number of tools, these process times are generally required to be in the range 1 to 3 minutes. This means that laser scribing rates up to many meters per second are required. Laser tools have already been built to achieve this. In some cases the tools have stationary optics which means the panel has to be moved very rapidly in one direction and then stepped in the other. To avoid excessive panel speed optics units having multiple parallel beams are often used. As an example of this a panel with dimension of about 1.1 m×1.1 m requiring 160 separate scribes can be processed with 8 parallel beams in under 100 second with the panel moving at a maximum speed of less than 300 mm/sec.

In the case discussed above the beam unit with multiple beams are stationary and the panel is moved in two dimensions but other arrangements are also possible. In another case the panel is held stationary and the beam or optics unit is moved in 2 dimensions by means of a moving gantry over the panel. An intermediate approach is also possible where the panel-moves in one axis and the optics unit moves in the other on a gantry over the panel Another solar panel scribing approach uses a single beam to scribe all the lines but causes the beam to move at high speed using a galvanometer driven mirror scanner system. US Patent Application Publication No. US2003/0209527A1 describes such a case. A scanner system is used to move the laser beam across the full width of a 600 mm wide panel at speeds up to 4 meters/sec while the panel is moved in the orthogonal direction past the scanner unit.

Application GB0611738.6 describes an extension of this invention where a scanner unit is used to move the beam at high speed as discussed in US2003/0209527A1 but the length of the beam scan region generated by the scanner unit is limited to a fraction of the total line length required rather than the full line length. The consequence of this is that multiple bands are needed to scribe the full lengths of the lines. This means that as well as the beam motion by the scanner unit motion of the substrate in two axes with respect of the scanner unit is required in order to cover the full area.

Whatever method of beam motion with respect to the panel is used the laser scribes in the electricity generating layer and top electrode layer need to be placed reliably very close to existing scribes in lower layers to minimize the inactive area between the scribes. Because of panel distortions and size changes during manufacture it is necessary to measure the position of previous scribes and compensate by adjusting the panel or beam motion to maintain accurate relative positioning. A global measurement of overall panel expansion or shrinkage is readily made by measuring the position and angle of the first and last scribes on a panel after loading. This data can be used to correct for these global changes by adjusting the parameters that control the beam motion with respect to the panel. However, simple global distortion correction is not sufficient to allow close and accurate placement of scribes since scribe pitch can become irregular due to errors on the tool that make the first scribe or errors introduced during subsequent panel processing.

An 'on-line' system that ensures that all scribes are accurately placed with respect to previous scribes. We call our alignment system "dynamic scribe alignment" (DSA). Application GB611718.6 describes the use of such an alignment system for the case where a scanner is used to move the beam and the panel is scribed in a series of parallel bands perpendicular to the scribe line direction. In this application we describe the use of a dynamic scribe alignment & system where scanners are not used and instead one or more beams are used to scribe the panel in a series of lines or bands parallel to the scribe direction.

DISCLOSURE OF INVENTION

One of the major problems that arises during the scribing of solar panels is the accurate control of scribe position on the surface of the panel. Most solar panel manufacturing arrangements require 3 separate sequential laser scribing operations. The first series of scribed lines are made in the lower electrode layer. The positioning accuracy requirements for the scribes in this first layer are much less critical compared to the subsequent scribes in the second and third layers since these later scribes have to be placed very accurately with respect to the previous scribes in order to minimise the inactive area of the panel between the three parallel scribes. This means that the scribes have to be placed as close together as possible but must not touch. The accuracy of beam placement required with respect to the existing scribes is at the 10 micrometer level or better.

If the panel is scribed with a single beam in a series of separate lines or by an optics unit having multiple beams in a series of bands of lines, a suitable detector system is used to measure the position on the panel of the existing scribes in a lower layer that are adjacent to the line or band being scribed while the scribing is taking place. The data gathered is stored and used to correct the panel or optics unit motion when the measured band is subsequently scribed. In this way the system is continuously measuring the exact position of the previously scribed lines in the next band to be scribed while accurate placement of secondary scribes with respect to primary scribes in each band is being performed. We call this alignment technique "dynamic scribe alignment" (DSA).

Dynamic scribe alignment (DSA) is implemented in its simplest form by attaching a suitable detector to each optics unit. The detector is offset from the beam centre in the direction perpendicular to the scribe lines by a distance that places it within the width of the adjacent scribe line band. In this position, as the optics unit is moved over the surface of the panel or the panel is moved below the optics unit, the detector records the position of one or more of the scribed lines in the band of lines that will next be scribed. Since the motion of the optics unit is along the scribe lines the detector is following one or more of the adjacent existing scribe lines. detector for this application is some form of optical imaging system where an image of the existing scribe line is projected onto a suitable 1- or 2-D array camera such as a CCD camera. Periodic logging of the output data from the camera gives information on the distance from the optics head to the scribe line or lines being followed and allows deviation of the scribes from the expected path to be recorded. This data is linked to data generated by the position encoders on the gantry or panel stage to give a complete record of the scribe line position over its full length. After a complete band has been scribed so that the complete set of data about the position of one or more scribe lines in the adjacent band has been recorded the data is processed and downloaded to the stage controller. This data download operation can take place during the time the panel or optics unit is moved from the position above the band that has just been laser scribed to the position above the adjacent band that has just been measured. The recorded and processed scribe position data is then used to correct the stage motion so that the trajectories of the lines scribed are corrected for minor displacements of the previously scribed lines and consequently the spacing between each new line and each previously scribed line can be accurately maintained.

A variety of sensors can be used as DSA detectors but the simplest form is likely to be based on optical imaging of the line scribed in the lower layer on to a one or two dimensional array detector. A 2D CCD camera is a good example of a suitable detector. The requirement for the detector is to measure the location of a line cut in one thin film when overlaid with another. Because of the different materials used in the various thin films the optical transmission properties of the film at the scribe position usually changes significantly so changes in the optical transmission can be readily measured. For example if the requirement is to locate a line scribed in a transparent conducting layer such as IT0 below an overcoated layer of amorphous silicon then this line can readily be located by an optical imaging system observing the line from either above the film layers or alternatively from below the film layers, through the panel, if the area of the panel around the scribed line is illuminated by light appropriately. Light illumination can be of either bright field or dark field type and can be incident on the panel from the same side as the detector or from the opposite side. In the former case the illuminating light source can be attached to the DSA detector camera or the illuminating light can even be directed through the imaging optics of the detector camera. In the case where the light illumination is from the opposite side of the panel to the detector camera then it is necessary to ensure the light source is mounted on a stage system that moves it in correspondence with the optics unit and associated DSA detector on the opposite side of the panel. If the optics unit delivers only a single beam to the panel then the ideal position for the DSA detector is such that it measures the position of the scribed line in a lower layer immediately adjacent to the one being scribed in the top layer. This means the offset from the beam position to the detector position in the direction perpendicular to the scribe direction is usually in the range 5 to 15 mm. If such a small offset is inconvenient then the detector can be displaced by a greater distance to observe prescribed lines that are displaced by several line pitch distances. Such a method leads to only minor loss in accuracy since distortion of the scribe position on the glass panel over the relatively small distance between the detector and the beam is unlikely to be significant.

If the optics unit delivers multiple beams to the panel such that a band containing many lines is scribed during the same pass of the unit over the panel then the ideal position for the DSA detector is such that it measures the position of a scribed line in a lower layer that is close to the centre of the next band to be scribed in the top layer. For example an optics unit that delivers 4 beams on a pitch of 20 mm to the panel 15 would most sensibly have the DSA detector located such that it measures the second or third prescribed lines in the next band of 4 lines to be scribed. Such a location would place the detector at 80 mm from the second or third lines in the band presently being scribed. As the pitch between the beams in a multiple head unit is usually fixed the DSA detector output data is used to apply a correction to the optics unit or panel stage position that must apply to all beams. Corrections to the positions of individual beams within the multiple beam unit is usually not possible but if the beam spacing is modest and the number of beams is not large then loss of accuracy of secondary scribe location with respect to previous scribes is low as the panel distortions occurring over the width of the multiple beam span is small.

For such a multiple beam optics unit the beam spacing is often a multiple of the scribe pitch as placing beams closer than several 10 of mm is inconvenient. For the example given above where the beam spacing is 20 mm and the requirement is to scribe lines on a 10 mm pitch then the stepping of the optics unit or panel in the direction perpendicular to the scribe lines at the end of each scribe pass is irregular with alternate steps of 10 mm and 70 mm. If the optics unit generates 4 beams on a pitch of 30 mm then to scribe lines on a 5 mm pitch is best be achieved by 5 steps of 5 mm followed by one of 95 mm. In these multiple beam cases the DSA detector is best placed to measure one of the prescribed lines close to the centre of the next band to be scribed.

If it is necessary to scribe lines parallel to either edge of the panel, each optics unit can have 2 DSA detectors attached to it. The detectors are mounted at 90 degrees to each other with offset directions from the optics unit centre line parallel to both stage axes. The offset distances from the optics head centre line are such as to place 10 the detectors over the centre of adjacent scribe bands in each case.

This method of 'dynamic scribe alignment' (DSA) is very effective as it allows local variations in scribe positions for all lines to be measured and compensated for without significantly slowing the overall scribing process. DSA achieves this as recording of the position of one or more of the scribe lines that already exist in a lower layer film on the panel occurs in one band at the same time as secondary lines are being accurately positioned and scribed in an upper layer in an adjacent band so no significant time is added to the scribing process. The only extra time required is that used to measure the first band of lines. However, since this alignment pass along the first band can be accomplished at the maximum stage speed permitted, which is significantly faster than the speed used while scribing lines and since there are multiple bands to be scribed, adding one additional high speed pass for gathering the data associated with the line positions in the first band adds a minor amount to the overall time.

DESCRIPTION OF DRAWINGS

Exemplary embodiments of the invention will now be described with reference to the accompanying drawings of which:

FIG. 1 shows one of the simplest forms of solar panel scribing arrangements. A large flat solar panel 11 consisting of glass, metal or polymer substrate coated with an ITO or other conducting or semi-conducting layer or combination of layers is mounted on a stage system that allows it to move in one axis X. The requirement is to scribe multiple parallel lines in the coating running parallel to the long side of the rectangular panel in the X direction. The beam 12 from a laser is passed to the optics head via mirrors and is focussed by a lens 13 onto the surface of the panel in order to scribe lines 14 on the panel. The optics unit is mounted on a moving carriage on a gantry over the panel so that it can move in the direction Y. Rows of scribe lines in the coating, running parallel to the X axis, are created in a series of lines as shown. After the beam has moved over the full panel length in X the optics unit is stepped in Y by the scribe line pitch and the process is repeated with the panel moving in the reverse X direction. In this way the whole panel area is scribed with multiple lines.

FIG. 2 shows a more complex arrangement where the requirement is to scribe lines in the solar panel coating that run parallel to the long edge of the rectangular panel using optics units that create multiple beams. The panel 21 is mounted on a stage that allows it to move in the X direction. Two laser beams 22/22' are directed to two optics units 23/23' that are separated in the Y direction by half the width of the panel. The optics units each contain beam splitting optics that allow them to generate 4 beams and are mounted on a carriage on a gantry over the panel that allows them to move in the Y direction. The full area of the panel is scribed in a series of bands running parallel to the long axis by moving the panel continuously in the X direction and performing scribing operations with both optics units at the same time. After the full length of the panel has been covered the optics units step in the Y direction by the width of the band and the process is repeated. In the particular case shown in FIG. 2 where the scribe line spacing is relatively large only about 3 passes of the panel are required to complete the scribing operation but in practice much larger number of passes are required. In particular if the scribe pitch required is only 5 mm yet the pitch of the 4 beams emitted by each optics unit is 30 mm then 6 passes with steps of 5 mm between are required followed by a step of 95 mm to complete each band. If a total of 96 lines need to be scribed then a total of 12 passes are required.

FIG. 3 shows a design for an optics unit in which the incoming single laser beam 31 is divided into 4 separate beams using three 50% beam splitters 32/32' and 32" and 3 fully reflecting mirrors 33, 33' and 33". Each beam is focussed by a lens 34 onto the surface of the panel 35 so that 4 parallel scribes can be made in each pass of the head over the panel. The spacing between the scribes can be adjusted by rotation of the complete optics head about a central axis. Optics units similar to that shown in FIG. 3 can be made that have any reasonable number of output beams. 2, 4 and 8 beam units are certainly readily envisaged while it is also possible to construct units with intermediate numbers of beams.

FIG. 4 shows a top view of an arrangement similar to that shown in FIG. 1 where a solar panel 41 can travel in the X direction and an optics unit 42 can travel over the panel in the Y direction. In the case shown the single incoming beam is divided into 8 separate beams in the optics unit so that 8 scribes are made on each pass. The solar panel has one or more film layers already applied that have previously been laser scribed 43 and the panel has then been over coated with an additional layer and the requirement is to scribe a further set of new lines 44 in the top coating parallel to and very close to the existing lines. In this case a DSA detector device 45 is mounted on to the optics unit as shown. The detector is facing downwards and is used in conjunction with the encoders in the X and Y axis stages to detect and record the position of existing scribe lines 43 on the panel. The detector is displaced in the Y direction from the optics head such that it views the surface of the panel at a point within an adjacent band of lines to the 8 presently being scribed 46. In the figure shown the detector is separated from the optics unit centre by a distance approximately equal to the width of the 8 scribe line pattern which means the detector records existing scribe position data corresponding to the approximate centre of the adjacent band. The detector can be mounted in other positions displaced in both X and Y directions from the optics unit centre position so long as it observes the surface of the panel at a point somewhere within the next band to be scribed. It is also possible to mount the DSA detector at a greater distance than the width of a single band if required but in this case accuracy of scribe placement with respect to existing scribes is likely to be lower due to possible distortion of the panel over the distance between the DSA detector and the optics unit.

During each pass of the panel under the optics head in the X direction, data on the existing scribe line positions in the adjacent band is collected and stored in a suitable computer. The optics unit is then stepped in Y so that the measured band is placed under the optics head, the processed scribe line position data is down loaded to the stage controller and another scribe pass is made on the measured band with the processed data used to correct the trajectory of the beams by movement of the optics unit in the Y direction to compensate for deviations of the existing scribe lines from the expected positions.

Figure 1:
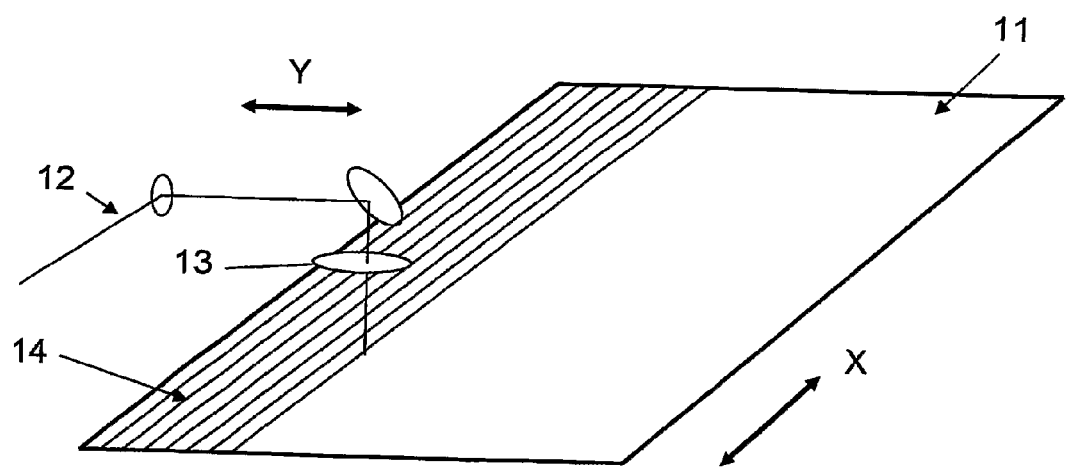
FIG. 1 shows a generalized diagram of an arrangement suitable for scribing solar panels by the standard method (without scanners) where a single laser beam scribes lines parallel to the longer side of a rectangular panel.
Figure 2:
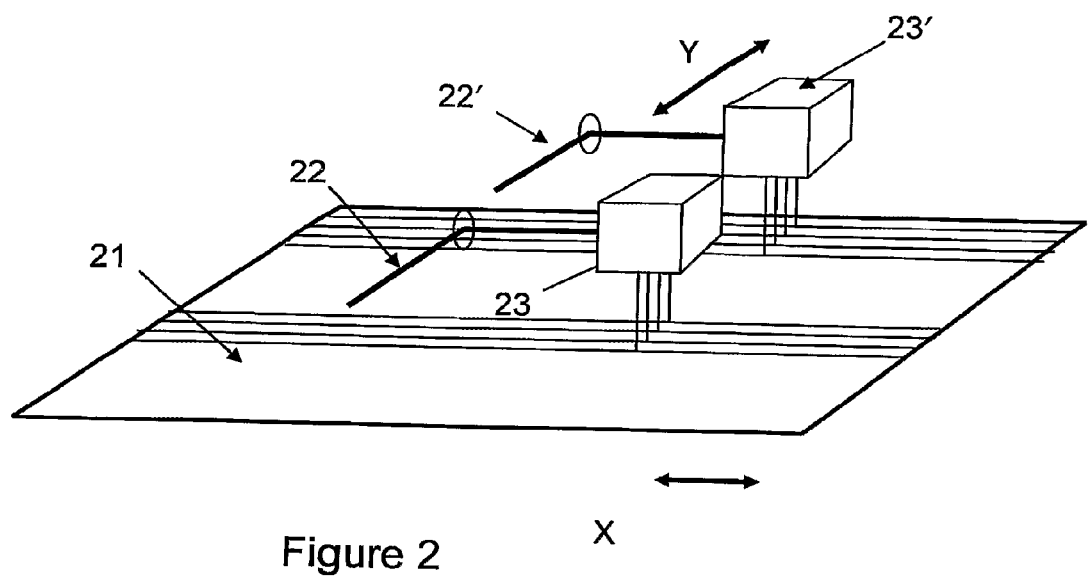
FIG. 2 shows a generalized diagram of an arrangement suitable for scribing solar panels by a more complex arrangement where 2 optics units, each delivering 4 beams, operate in parallel to scribe lines parallel to the longer side of a rectangular panel.
Figure 3:
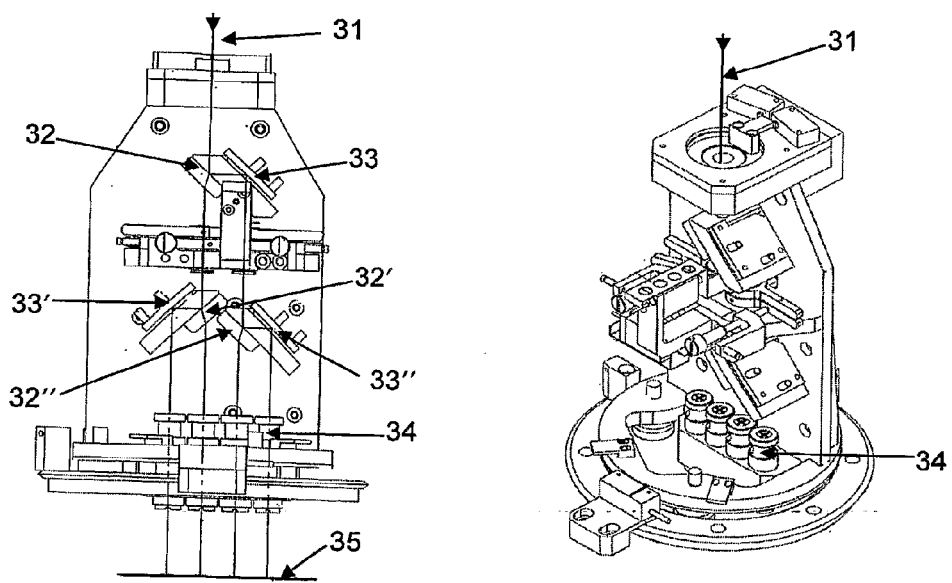
FIG. 3 shows an example of an optics unit where an incoming single beam is divided into 4 separate beams which are then focussed on the panel surface.
Figure 4:
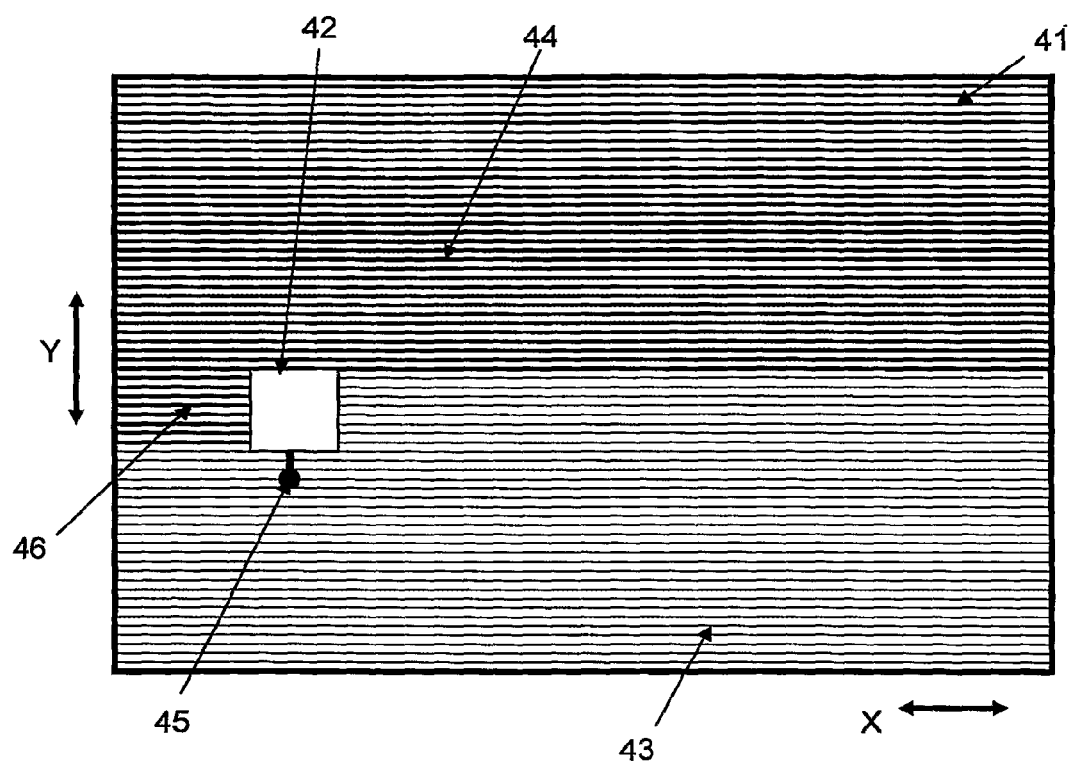
FIG. 4 shows a plan of a solar panel scribing tool arrangement with a single optics unit delivering 8 parallel beams to the panel with a detector attached to the unit for dynamic scribe alignment of a new set of scribe lines to existing scribe line positions.
Figure 5:
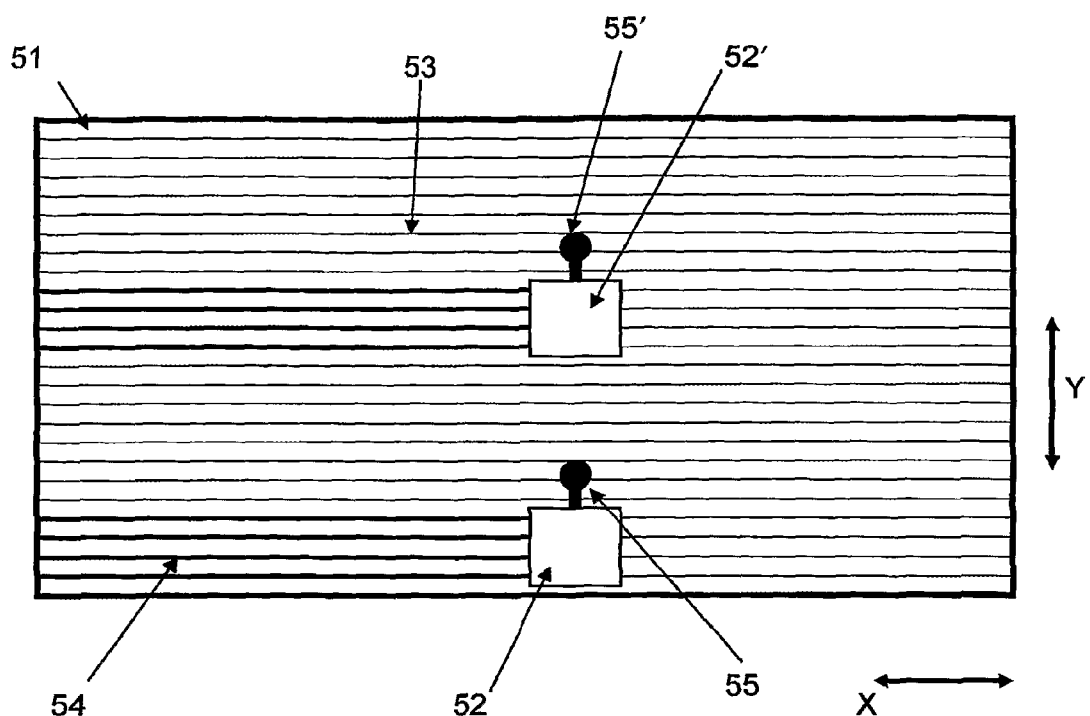
FIG. 5 shows a plan of a solar panel scribing tool arrangement with 2 optics units each delivering 4 beams to the panel and each having a detector used for dynamic scribe alignment of a new set of scribe lines to existing scribe lines.

FIG. 4 shows the particular case of a panel that is fully processed by means of 9 passes of the panel under the optics unit. The first pass is an alignment pass where the DSA detector measures the location of an existing scribe line in the first band, located at the top of the figure shown. During this pass the laser is inactive. After this alignment pass the optics head is moved in the Y direction to correspond to the first band of lines to be scribed. During the next pass of the panel under the optics unit the data generated on the alignment pass is used to continuously correct the position of the optics unit in the Y direction while the panel is moving under it in X in order to position the 8 laser scribes as close as possible to the existing scribes. A further 7 passes are made to give rise to a total of 8 bands of scribe lines or 64 scribes in total. The figure shows the process in the middle of the 6th pass. The panel is moving in the X direction towards the left hand side of the figure and the optics unit is scribing 8 secondary scribes adjacent to existing scribes in the band below the head while the detector on the head is detecting the position of previous layer scribe lines in the next band to be scribed. Small corrections to the Y positions of the optics unit are made during each pass, using the data gathered during the previous pass, to keep the laser scribes accurately positioned with respect to the pre-scribed lines. FIG. 5 shows a top view of an arrangement similar to that shown in FIG. 2 where a solar panel 51 can travel in the X direction and 2 optics units 52/52' can travel over the panel in the Y direction. In this case the 2 optics units are mounted on separate carriages on the Y stage so that they can be independently positioned. Each optics unit creates 4 parallel scribes during one pass. The solar panel has one or more film layers already applied that have previously been laser scribed 53 and the panel has then been over coated with an additional layer and the requirement is to scribe a further set of new lines 54 in the top coating parallel to and very close to the existing lines. In this case DSA detector devices 55, 55' are attached to each optics unit as shown. The detectors face downwards and are used in conjunction with the encoders in the X and Y axis stages to detect and record the position of the existing scribe-lines 53 on the panel. The detectors are displaced in the Y direction from the optics unit centre positions such that they view the surface of the panel at positions close to the middle of the next band of existing scribe line adjacent to the band presently being processed. In the figure shown the detectors are separated from the beam line centre by distances approximately equal to one scribe band width which means the detectors record line position data corresponding approximately to the centre of the adjacent band. The detectors can be mounted in other positions with respect to the optics units so long as they observe the surface of the panel at points that are not too far away from the optics units so as to compromise accuracy of scribe placement.

During each pass of the panel under the optics heads in the X direction, data on the existing scribe line positions in the adjacent bands is collected and stored in a suitable computer. The optics heads are then stepped in Y so that the measured bands are placed under the optics heads, the processed scribe line position data is down loaded to the stage controller and another scribe pass is made on the measured bands with the processed data used to correct the trajectory of the beams by movement of the head in the Y direction to compensate for deviations of the existing scribe lines from the expected positions. The 2 optics heads operate independently in terms of the movements made in the Y direction at the end of each pass and in terms of the Y movements made during each pass in order that both maintain accurate positioning of the lines being scribed with respect to the existing scribe lines on the panel FIG. 5 shows the particular case of a panel that is fully processed by means of 4 passes of the optics head over the panel. The first pass is an alignment pass where the DSA detectors measure the location of existing scribes in the first bands to be scribed. During this pass the lasers are inactive. The next pass uses the data generated on the alignment pass to correct the position of both optics heads in the Y direction while the panel is moving under them in X to position the 4 laser scribes generated by each optics unit as close as possible to the existing scribes. A further 2 passes are made to give rise to a total of 6 bands of scribe lines each with 4 lines or 24 scribes in total. This arrangement is shown only as an example as in practice a larger number of lines would be used.

The figure shows the process in the middle of the 2nd pass. The panel is moving in the X direction towards the left hand side of the figure and the optics units are each scribing 4 secondary scribes adjacent to existing scribes in the band below each unit while the detector on the unit is detecting the position of previous layer scribe lines in the next band to be scribed. Small independent corrections to the Y positions of each unit are made during each pass, using the data gathered during the previous pass, to keep the laser scribes accurately positioned with respect to the pre-scribed lines.

FIG. 5 shows the particular case where 2 independent optics units each generating 4 beams are mounted on the gantry stage over the panel. This is not an exclusive arrangement and other arrangements where more optics units are used are also possible. If the panel is large then numbers of independent optics units up to 4, 6 or 8 can be readily envisaged. These units can each deliver any number of beams. The optimum geometry in terms of number of optics units and number of beams per unit is based on the size of the panel, the number of lines to be scribed, the process time required and, most importantly, the degree of distortion of the panel when the thin film layer is applied over the earlier scribed lines on the panel.

In all the figures shown above the single beam, or optics unit with multiple beams, are able to move in one axis as they are attached to one or more moving carriages on a stage on a gantry over the panel. The other axis of motion is provided by an orthogonal stage that carries the panel under the gantry. This is not an exclusive arrangement and other geometries are also possible. For the case of a single optics unit this can be held stationary and the panel moved in 2 orthogonal axes X and Y. In this way the Y motion steps between passes or the Y motion corrections during each pass are accomplished by movement of the panel in Y. For the case where there are multiple optics units the Y motion steps between passes can still be accomplished by the panel Y motion but it is necessary to mount all but one of the optics units on additional small travel Y stages in order to allow fine independent Y motion of all units to ensure accurate positioning of all laser scribes with respect to existing scribes. In a third case the panel is held stationary and the optics unit or units are moved in 2 orthogonal axes. This is achieved by means of a gantry over the panel that is able to move over the full length of the panel, the gantry supporting a second stage which allows the optics units to move across the width of the panel. If there is more than one optics unit then each unit has independent control.

What is claimed is:

1. A device for accurately positioning laser scribed lines by processing a thin top layer of material which overcoats one or more other lower layers in which lines have already been scribed for the purpose of making solar panels, said device comprising:

an optics unit for generating one or more laser beams in order to scribe one or more lines in the top layer of the solar panel;

an alignment detector system that is attached to the optics unit, the alignment detector system being displaced from the optics unit by a distance such that the alignment detector system measures the position of one of the scribes in one of the lower layers in the area of the panel that will be scribed at a subsequent time;

a motion system for moving the solar panel with respect to the optics unit, wherein the alignment detector system is configured to follow the path of one or more of the lines scribed in the one of the lower layers and to measure the position of said line or lines over the full length while the optics unit proceeds with laser scribing of the top layer in a different area of the panel; and a control and motion system for receiving data from the alignment detector system attached to the optics unit for correcting the relative position of the optics unit with respect to the solar panel in the direction perpendicular to the scribe direction in order to allow the laser scribed lines to be accurately placed with respect to lines already scribed in a lower layer.

2. The device as claimed in claim 1, wherein the optics unit delivers a single beam to the panel.

3. The device as claimed in claim 1, wherein the optics unit delivers a plurality of beams to the panel.

4. The device as claimed in claim 1, wherein said optics unit is a single optics unit associated with the alignment detector system which is configured to scribe the panel in a series of single lines.

5. The device as claimed in claim 1, further comprising a set of said optics units, each associated with a respective alignment detector system and each able to move independently in the direction perpendicular to the scribe line direction, wherein said set of optics units are used in parallel to scribe the panel in a series of bands of scribes.

6. The device as claimed in claim 1, wherein the optics unit and associated alignment detector system are configured to be situated on the coated side of the panel.

7. The device as claimed in claim 1, wherein the optics unit and associated alignment detector system are configured to be situated on the opposite side of the panel to the coated side.

8. The device as claimed in claim 1, wherein the alignment detector system consists of an optical system that creates an image of the pre-scribed line in one of the lower layers on a one or two dimensional array detector.

9. The device as claimed in claim 1, wherein the panel is moved by the motion system in one axis on a linear stage and the optics units and associated alignment detector system are arranged to move independently on an orthogonal stage mounted over or under the panel.

10. The device as claimed in claim 1, wherein the panel is held stationary during scribing and the optics unit and associated alignment detector system is arranged to move independently on an orthogonal stage mounted over or under the panel, said stage being mounted on a another stage that moves the first stage along the full length of the panel.

11. The device as claimed in claim 1, wherein a single optics unit and associated alignment detector system are arranged to be held stationary during scribing and the motion system is configured to move the panel in two axes to cover the full panel area.

12. The device as claimed in claim 1, wherein the motion system is configured to move the panel along two axes to cover the full panel area and more than one optics units are provided, each with its associated alignment detector system, one optics unit being fixed and all others being able to move independently on a stage in the direction perpendicular to the scribe line direction.

* * * * *